(12) United States Patent
Loh et al.

(10) Patent No.: US 11,949,053 B2
(45) Date of Patent: Apr. 2, 2024

(54) STENCIL PRINTING FLUX FOR ATTACHING LIGHT EMITTING DIODES

(71) Applicant: Lumileds LLC, San Jose, CA (US)

(72) Inventors: Chee-Jong Loh, Pulau Pinang (MY); Khar Kheng Tok, Pulau Pinang (MY); Chew-Hong Lee, Pulau Pinang (MY)

(73) Assignee: Lumileds LLC, San Jose, CA (US)

( * ) Notice: Subject to any disclaimer, the term of this patent is extended or adjusted under 35 U.S.C. 154(b) by 224 days.

(21) Appl. No.: 17/210,864

(22) Filed: Mar. 24, 2021

(65) Prior Publication Data

US 2022/0190219 A1 Jun. 16, 2022

Related U.S. Application Data

(60) Provisional application No. 63/124,959, filed on Dec. 14, 2020.

(51) Int. Cl.
*H01L 33/62* (2010.01)
*H01L 23/00* (2006.01)

(52) U.S. Cl.
CPC .............. *H01L 33/62* (2013.01); *H01L 24/16* (2013.01); *H01L 24/81* (2013.01); *H01L 2224/16227* (2013.01); *H01L 2224/81024* (2013.01); *H01L 2224/812* (2013.01); *H01L 2224/81815* (2013.01); *H01L 2924/12041* (2013.01); *H01L 2933/0066* (2013.01)

(58) Field of Classification Search
CPC ......... H01L 33/62; H01L 24/16; H01L 24/81; H01L 2224/16227; H01L 2224/81024; H01L 2224/812; H01L 2224/81815; H01L 2924/12041; H01L 2933/0066; H01L 2223/54426; H01L 23/544

USPC .......................................................... 257/99
See application file for complete search history.

(56) References Cited

U.S. PATENT DOCUMENTS

| | | | | |
|---|---|---|---|---|
| 6,162,661 A | * | 12/2000 | Link | B23K 3/0692 |
| | | | | 257/E21.508 |
| 10,186,549 B1 | * | 1/2019 | Cheung | H01L 33/005 |
| 10,236,409 B2 | | 3/2019 | Wildeson et al. | |

(Continued)

FOREIGN PATENT DOCUMENTS

| | | | |
|---|---|---|---|
| CN | 111370562 A | * | 7/2020 |
| EP | 1566848 A2 | | 8/2005 |

(Continued)

*Primary Examiner* — Nduka E Ojeh
*Assistant Examiner* — Laura M Dykes
(74) *Attorney, Agent, or Firm* — Servilla Whitney LLC

(57) ABSTRACT

A light emitting diode (LED) device comprises: an interposer comprising: an interposer body, a plurality of pillars on a first surface of the interposer body, and two or more local fiducials on the first surface of the interposer body; an LED die comprising a die body and a first die surface comprising a plurality of light emitting diodes (LEDs), the LED die being mounted on the plurality of pillars; and a flux material located between each of the pillars and a second die surface of the die body, the second die surface of the die body being opposite the first die surface, there being no flux material on a fiducial surface of each of the local fiducials. Methods of manufacturing a light emitting diode (LED) devices comprise: printing a flux material onto the pillars of the interposer, attaching an LED die to the pillars, and washing away excess flux material.

16 Claims, 5 Drawing Sheets

(56) References Cited

U.S. PATENT DOCUMENTS

| | | |
|---|---|---|
| 10,541,352 B2 | 1/2020 | Ishikawa et al. |
| 10,749,070 B2 | 8/2020 | Wildeson et al. |
| 2002/0139987 A1 | 10/2002 | Collins, III et al. |
| 2008/0244900 A1* | 10/2008 | Maeda .................... H01L 24/11 257/E21.511 |
| 2011/0205049 A1 | 8/2011 | Kmetec et al. |
| 2015/0129918 A1 | 5/2015 | Ikegami et al. |
| 2015/0357256 A1 | 12/2015 | Suthiwongsunthorn et al. |
| 2016/0016399 A1* | 1/2016 | Bower ................ B41F 16/0046 101/287 |
| 2016/0230954 A1* | 8/2016 | Ha ..................... G02B 19/0061 |
| 2016/0293811 A1 | 10/2016 | Hussell et al. |
| 2017/0098746 A1 | 4/2017 | Bergmann et al. |
| 2017/0301559 A1* | 10/2017 | Wang ................ H05K 3/1216 |
| 2018/0053739 A1* | 2/2018 | Seddon ............. H01L 21/4853 |
| 2020/0111939 A1* | 4/2020 | Brodoceanu ............ H01L 24/81 |
| 2021/0005584 A1* | 1/2021 | Cho ................... H01L 25/0753 |

FOREIGN PATENT DOCUMENTS

| | | | | |
|---|---|---|---|---|
| JP | H02165633 A | * | 6/1990 | |
| JP | 2017139343 A | * | 8/2017 | ....... H01L 21/02052 |
| KR | 100998279 B1 | * | 12/2010 | |
| WO | 2014150263 A1 | | 9/2014 | |

\* cited by examiner

STENCIL PRINTING FLUX FOR ATTACHING LIGHT EMITTING DIODES

CROSS-REFERENCE TO RELATED APPLICATIONS

This application claims priority to U.S. Provisional Application No. 63/124,959, filed Dec. 14, 2020, the entire disclosure of which is hereby incorporated by reference herein.

TECHNICAL FIELD

Embodiments of the disclosure generally relate to light emitting diode (LED) devices and methods of manufacturing the same. More particularly, embodiments are directed to stencil printing flux onto pillars of an interposer while avoiding depositing flux on local fiducials in a continuous or semi-continuous operation, and to the LEDs resulting from this process.

BACKGROUND

A light emitting diode (LED) is a semiconductor light source that emits visible light when current flows through it. LEDs combine a p-type semiconductor with an n-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$) or silicon carbide (SiC).

A plurality of LEDs is arranged on an LED die in an array-type format. The LEDs may be integral to the die or may be placed and adhered thereto. Thereafter, the LED dies are incorporated into numerous types of devices.

Interposers, for example through-silicon via (TSV) interposers, are utilized within LED-based devices as an electrical interface with the LED dies. Some interposers comprise a combination of pillars for both electrical transport and adhering purposes for integration with one or more LED dies; and local fiducials, which are used for precision placement of the interposer during manufacture.

Being able to handle and assemble arrays of LEDs efficiently and precisely is a continuous goal. In addition, being able to precisely process interposers for use with LED dies is a continuous goal.

SUMMARY

Provided herein are light sources and methods of making them.

In a first aspect, a light emitting diode (LED) device comprises: an interposer comprising: an interposer body, a plurality of pillars on a first surface of the interposer body, and two or more local fiducials on the first surface of the interposer body; an LED die comprising a die body and a first die surface comprising a plurality of light emitting diodes (LEDs), the LED die being mounted on the plurality of pillars; and a flux material located between each of the pillars and a second die surface of the die body, the second die surface of the die body being opposite the first die surface, there being no flux material on a the first surface of the interposer outside of a perimeter of the LED die. In one or more embodiments, there is also no flux material on a fiducial surface of each of the local fiducials.

In a second aspect, a method of manufacturing a light emitting diode (LED) device comprises: printing a flux material onto a pillar surface of each pillar of a plurality of pillars on a first surface of an interposer body of an interposer such that the first surface is not printed with the flux material to form a first intermediate printed structure; attaching an LED die comprising a die body and a first die surface comprising a plurality of light emitting diodes (LEDs) to the first intermediate printed structure with the flux material such that the flux material is located between each of the pillars and a second surface of the die body, the second surface of the die body being opposite the first surface of the die body to form a second intermediate attached structure; and washing away the flux material where it is exposed to form the LED device. In one or more embodiments, a fiducial surface of each of two or more local fiducials on the first surface of the interposer body is not printed with the flux material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements. The figures herein are not to scale.

DETAILED DESCRIPTION

Figure 1:
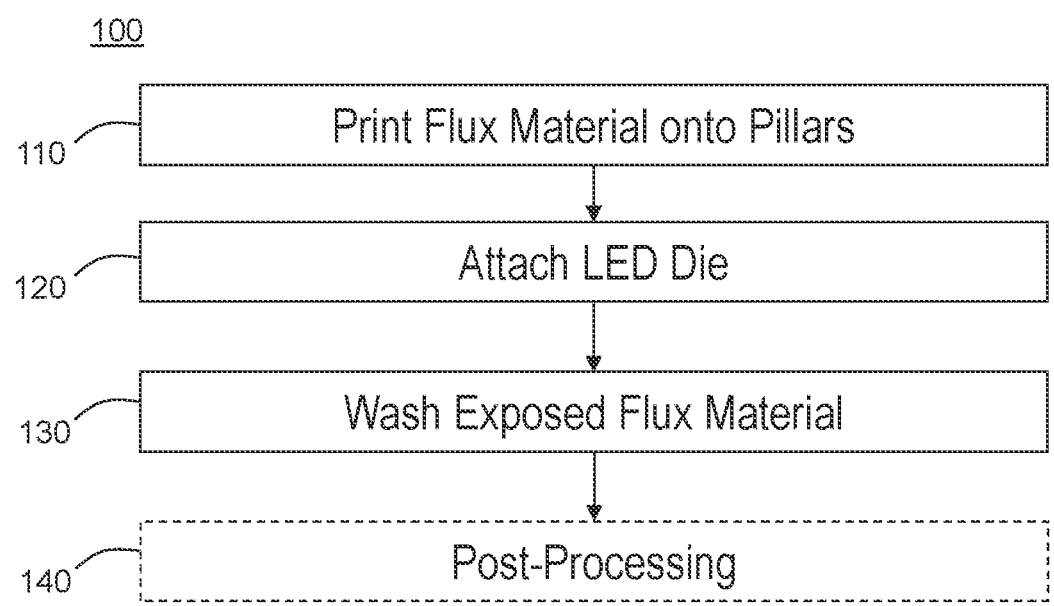
FIG. 1 provides a general exemplary process flow diagram for manufacture of a light emitting diode (LED) device.

Before describing several exemplary embodiments of the disclosure, it is to be understood that the disclosure is not limited to the details of construction or process steps set forth in the following description. The disclosure is capable of other embodiments and of being practiced or being carried out in various ways.

Reference to LED refers to a light emitting diode that emits light when current flows through it. In one or more embodiments, the LEDs herein have one or more characteristic dimensions (e.g., height, width, depth, thickness, etc. dimensions) in a range of greater than or equal to 75 micrometers to less than or equal to 300 micrometers. In one or embodiments, one or more dimensions of height, width, depth, thickness have values in a range of 100 to 300 micrometers. Reference herein to micrometers allows for variation of ±1-5%. In a preferred embodiment, one or more dimensions of height, width, depth, thickness have values of 200 micrometers ±1-5%. In some instances, the LEDS are referred to as micro-LEDs (uLEDs or µLEDs), referring to a light emitting diode having one or more characteristic dimensions (e.g., height, width, depth, thickness, etc. dimensions) on the order of micrometers or tens of micrometers. In one or embodiments, one or more dimensions of height, width, depth, thickness have values in a range of 2 to less than 75 micrometers, for example from 2 to 50 micrometers, or from 2 to 25 micrometers. Overall, in one or more embodiments, the LEDs herein may have a characteristic dimension ranging from 2 micrometers to 300 micrometers, and all values and sub-ranges therebetween.

Methods of depositing thin films include but are not limited to: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Methods herein including printing flux material onto interposers in a precise manner, which reduces waste, improves quality, and increases throughput. These methods eliminate a need to use a conventional dipping process to apply flux materials to interposers prior to LED attachment. Advantageously, flux material deposit is achieved in a contactless manner in that there is no contact of a stencil with the interposer's features (e.g., pillars). In this way, damage to the pillars during handling can be minimized and even avoided. Also advantageously, flux material deposit outside of a peripheral area of the pillars and on local fiducials is avoided. Rather than flipping the interposer to dip its top surface including pillars and local fiducials into a supply of flux material, the printing method herein positions the interposer in a reverse manner, with its top surface up, utilizing a stencil design that covers the local fiducials, which in turn act as stoppers to avoid contact of the stencil with the pillars. Avoiding flux material deposition on the local fiducials facilitates die placement accuracy. In addition, volume of flux material is controlled to a desired amount, reducing excesses present during the conventional dipping process. By depositing a minimum amount of flux material on the pillars, creation of voids that can lead to electrical failure of an LED device is minimized.

Suitable flux materials are those available in the art as surface activators for soldering, and are compatible with materials of the interposer and LED dies. Suitable materials easily flow through opening of a stencil while also providing tackiness to attach an LED die to an interposer. In one or more embodiments, the flux materials are tacky and/or water soluble materials. Water soluble materials facilitate removal of any excess flux material by a washing operation.

Figure 3A:
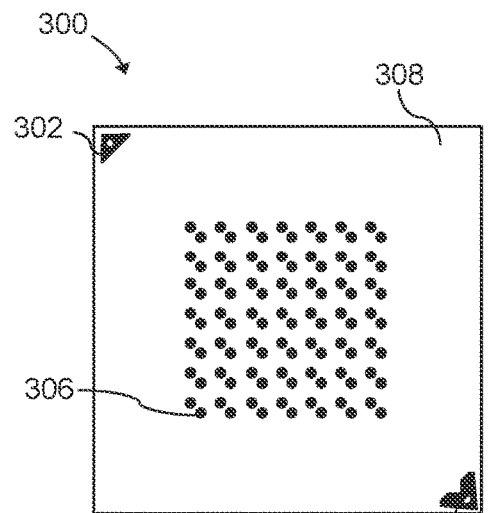
FIG. 3A illustrates a top schematic view of an exemplary interposer.

FIG. 3A illustrates a top schematic view of an exemplary interposer 300, which comprises an interposer body 308, and a plurality of pillars 306 on a first/top surface of the interposer body 308. A first local fiducial 302 is located in one corner of the interposer 300, and a second local fiducial 304 is located in an opposite corner of the interposer 300. For illustration purposes only, the interposer 300 is designed to receive a 7×7 LED die. Larger dies are contemplated as well, for example 40×40 or even 100×100 or larger. The number of pillars and their arrangement may be varied to accommodate desired product designs. For illustration purposes only, there are two local fiducials 302, 304 on the interposer 300. The number of local fiducials and their arrangement may be varied to accommodate desired product designs.

Figure 4:
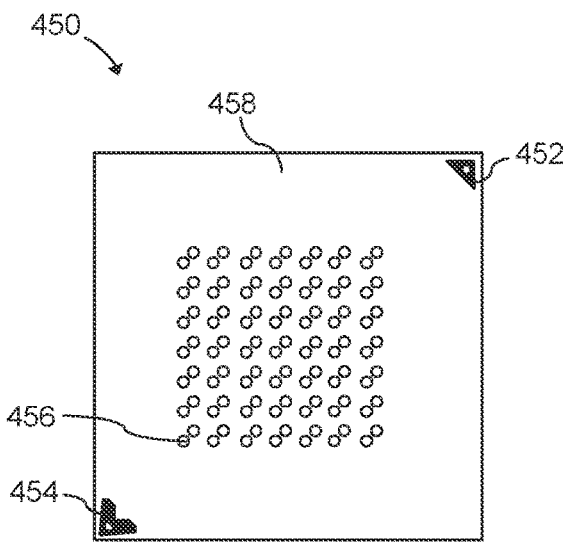
FIG. 4 illustrates a bottom schematic view of a stencil according to one or more embodiments.

FIG. 4 illustrates a bottom schematic view of a stencil 450 according to one or more embodiments, the stencil 450 comprising a stencil body 458, and a plurality of openings 456 through a first/top surface of the stencil body 458. A first fiducial mark 452 is located in one corner of the stencil, and a second fiducial mark 454 is located in an opposite corner of the stencil. The fiducial marks are visible from the bottom view of the stencil (not a top view). For illustration purposes only, the stencil 450 is designed to print to the interposer 300, which is designed to receive a 7×7 LED die. Larger stencils are contemplated as well, for example to receiving LED dies sized 40×40 or even 100×100 or larger. It is understood that number of openings and their arrangement may be varied to accommodate desired interposer designs. For illustration purposes only, there are two fiducial markings 452, 454 on the stencil 450. The number of fiducial markings and their arrangement may be varied to accommodate desired interposer designs. Stencils are constructed from durable materials that are compatible with the interposer and LED dies. In one or more embodiments, the stencil comprise a platinum-group metal.

Figure 5A:
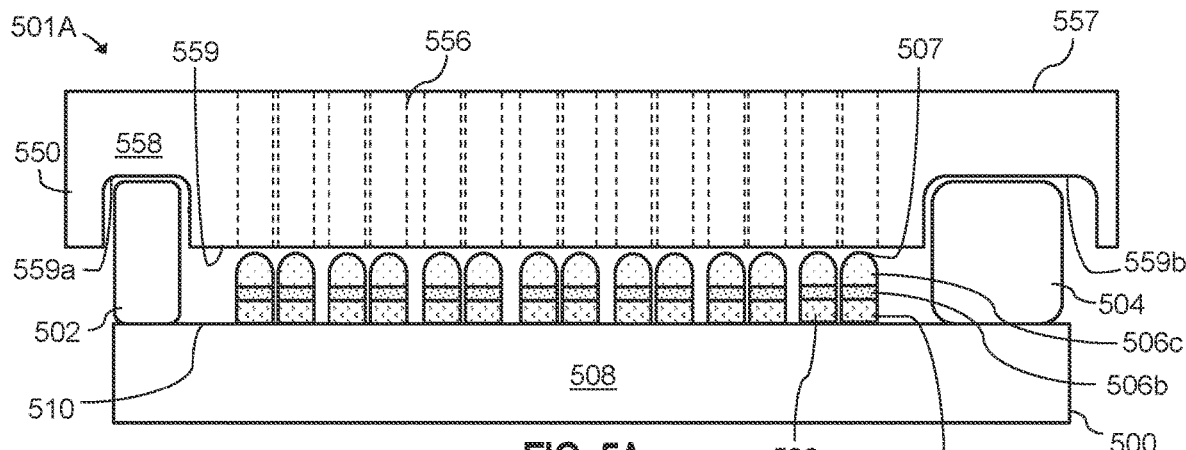
FIG. 5A illustrates a side schematic view of an interposer and a stencil according to one or more embodiments.

FIG. 5A illustrates a side schematic view of a combination 501A of an interposer 500 and a stencil 550 according to one or more embodiments. The interposer 500, analogous to FIG. 3A, comprises an interposer body 508, and a plurality of pillars 506 on a first/top surface 510 of the interposer body 508. A first local fiducial 502 is located in one corner of the interposer 500, and a second local fiducial 504 is located in an opposite corner of the interposer 500.

In one or more embodiments, each of the plurality of pillars 506 comprises multiple layers of materials. In one or more embodiments, the materials of the pillars are conductive metals. In one or more embodiments, each layer of the pillars is a different material. The pillars may be formed by known methods of depositing thin films. In one or more embodiments, each of the pillars extends to a height in a range of 25 micrometers to 50 micrometers from the top surface of the interposer. In one or more embodiments, each of the pillars spans a side-to-side width in a range of 25 micrometers to 50 micrometers. Each of the pillars 506 comprises a pillar surface 507. In the embodiment of FIG. 5A, each of the pillars 506 comprises a first layer 506a, a second layer 506b, and a third layer 506c. The first layer 506a is in contact with the first surface 510 of the interposer body 508, the second layer 506b is in contact with the first layer 506a, and the third layer 506c is in contact with the second layer 506b. In one or more embodiments, the first layer comprises copper (Cu), the second layer comprises nickel (Ni), and the third layer comprises tin (Sn). In some embodiments, the layer comprising tin is known as a "capping layer".

The stencil 550, analogous to stencil 450 of FIG. 4, comprises a stencil body 558, and a plurality of openings 556 through a first/top surface 557 of the stencil body 558.

Fiducial markings of the stencil are not visible in the side view. A second/bottom surface 559 of the stencil body 558, opposite the first/top surface 557, comprises a first feature or groove 559a to accommodate the first local fiducial 502, and a second feature or groove 559b to accommodate the second local fiducial 504. The sizing of the features for accommodating the local fiducials can vary depending on the application. In one or more embodiments, features span one-half or more of heights of the local fiducials. During use, the stencil 550 rests on local fiducials 502 and 504, which results in contactless printing onto the pillars 506.

The openings 556 are generally sized to be greater than a width of each of the pillars. In one or more embodiments, the openings are at least 10 micrometers larger than the pillar widths. For an exemplary pillar width of 50 micrometers (±5%), the opening would be 60 micrometers (±5%).

FIG. 1 provides a general exemplary process flow diagram for manufacture of a light emitting diode (LED) device. Generally, a method of manufacturing a light emitting diode (LED) device 100 comprises: printing a flux material onto pillars of an interposer at operation 110; attaching an LED die at operation 120; washing exposed flux material at operation 130; and optionally thereafter conduct any post-processing at operation 140.

Figure 5B:
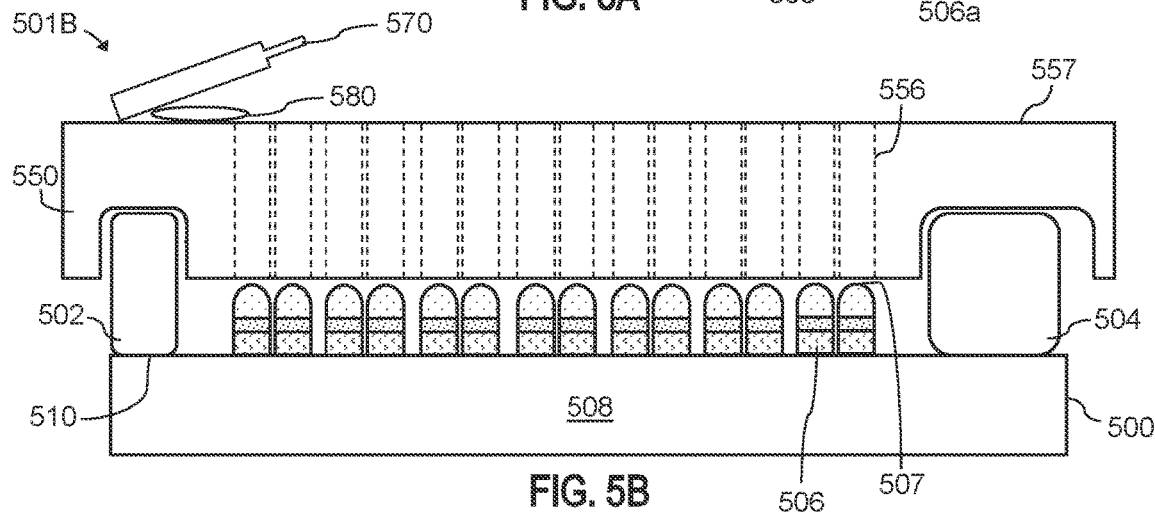
FIG. 5B illustrates a side schematic view of an interposer and a stencil in context prior to conducting a printing operation according to one or more embodiments.
Figure 5C:
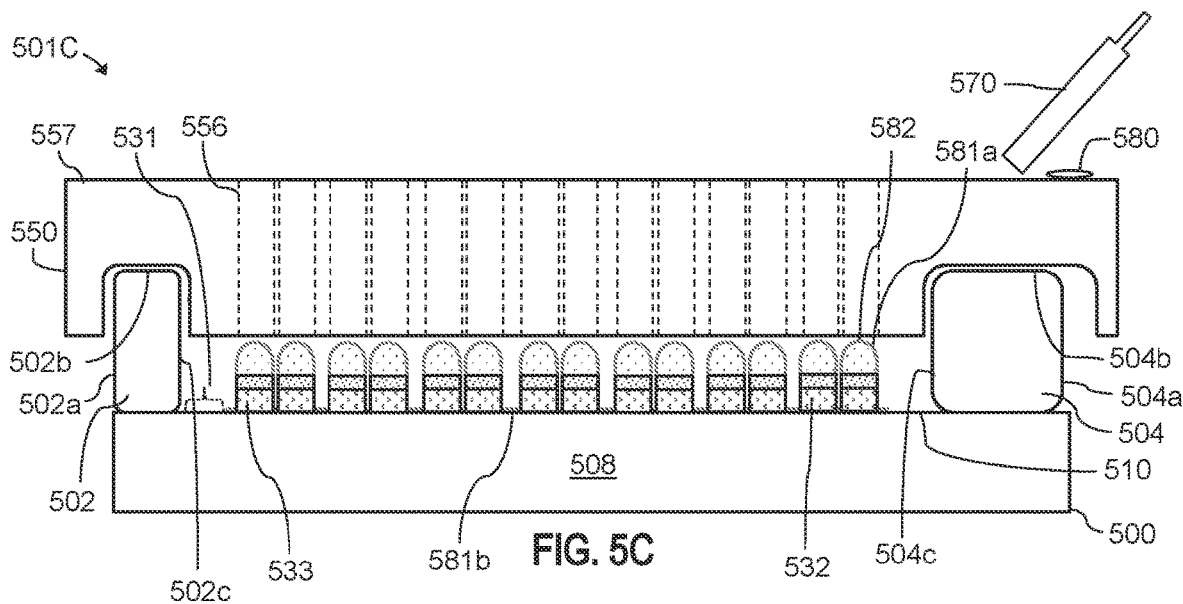
FIG. 5C illustrates a side schematic view of an interposer and a stencil in context after conducting the printing operation according to one or more embodiments.

Regarding the exemplary printing operation 110 of FIG. 1, and with specific reference to FIGS. 5B-5C, a flux material 580 is deposited on the pillar surface 507 of each pillar 506 of the plurality of pillars, which are on the first surface 510 of the interposer body of an interposer 508. Shown in FIG. 5B is a side schematic view of an interposer and a stencil in context prior to conducting a printing operation according to one or more embodiments. The combination 501B includes the interposer 500, the stencil 550, and a blade 570 and the flux material 580 in a starting position. In this exemplary embodiment, the blade 570 and the flux material 580 are located at one side of the top surface 557 of the stencil 550. The blade 570 is made of a material that is compatible with the flux material and stencil surface. In one or more embodiments, the blade 570 is an elastomeric polymer providing good integrity and flexibility to push the flux material through the openings. Shown in FIG. 5C is a side schematic view of an interposer and a stencil in context after conducting the printing operation according to one or more embodiments. The combination 501C includes the interposer 500, the stencil 550, and the blade 570 and the flux material 580 in a second position. From the combination 501B to the combination 501C, the blade 570 and the flux material 580 have been moved across the openings 556, the flux material 580 being pushed through the openings and deposited onto the pillars. In this exemplary embodiment, the blade 570 and the flux material 580 of combination 501C finish at a second side of the top surface 557 opposite the openings as compared to combination 501B. As shown in FIG. 5C, after conducting the printing operation, surfaces of the interposer pillars now have a coating of flux 581a, yielding flux-coated pillars 532. The flux material at least coats a top edge 582 of the pillars. The flux material may also create a coating 581b along the first surface 510 of the interposer body 508 at a base of the pillars when the openings 556 are larger than the width of the pillars. The flux material may also coat vertical surfaces of the pillars. In one or more embodiments, the flux material substantially coats all surfaces of the pillars and the interposer surface at the bases of the pillars.

Figure 3B:
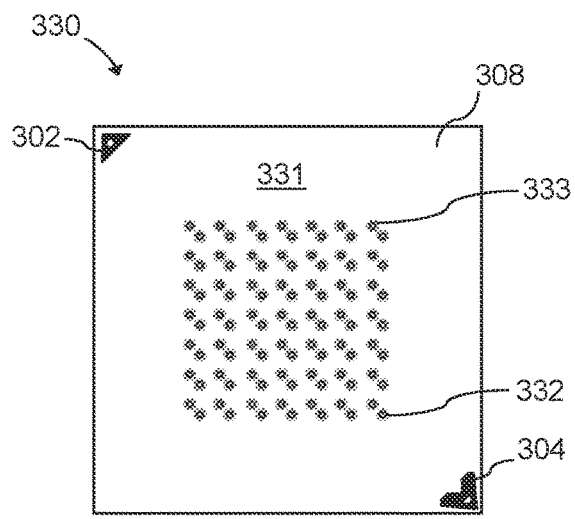
FIG. 3B illustrates a top schematic view of a first intermediate printed structure according to one or more embodiments.

Referring to FIGS. 3B and 5C, one or more and/or all fiducial surfaces of each of the local fiducials are not printed with the flux material. And there is no flux outward from a perimeter formed by the outermost pillars. In FIG. 5C, there is not flux on any of the surfaces 502a, 502b, 502c of the first local fiducial 502. Similarly, there is not flux on any of the surfaces 504a, 504b, 504c of the second local fiducial 504. In addition, as shown in FIG. 3B, illustrating a top schematic view of a first intermediate printed structure 330 according to one or more embodiments, the first intermediate printed structure 330 comprises the interposer body 308 and a plurality of flux-coated pillars 332 on the first surface of the interposer body 308. Analogous to FIG. 3A, the first local fiducial 302 remains is located in one corner of the first intermediate printed structure 330, and the second local fiducial 304 remains located in the opposite corner. Outermost pillars and their bases 333 in combination create a perimeter, beyond which 331 there is no flux. In FIG. 5C, an embodiment of the first intermediate printed structure is the interposer 500 as shown with its features, and the area of no flux 531 of the first surface 510 of the interposer body 508 outward from an outermost pillar 533, and allowing for some flux 581b as the base of the pillar 533 is shown.

Regarding the attaching operation 120 and the washing operation 130 of FIG. 1, an LED die is attached to the first intermediate printed structure with the flux material to form a second intermediate attached structure. For attaching, the LED die is moved into place onto the flux-coated pillars of the interposer such that the flux material is located between each of the pillars and a second die surface of the die body. For example, the LED die is positioned above the interposer by a mechanical arm, lowered into place onto the pillars, remaining in contact with the flux for a duration effective to attach the LED die. In one or more embodiments, the LED die comprises conducting pads, and it is the conducting pads that contact the pillars. Any exposed flux material, e.g., 581b of FIG. 5C, is washed away thereafter, at which point the LED device is formed. Washing techniques are in accordance with methods that remove excess flux without damaging the first intermediate printed structure. In one or more embodiments, the washing operation is conducted using one or more direct jets of water aimed at the interposer surface to remove excess flux.

Figure 3C:
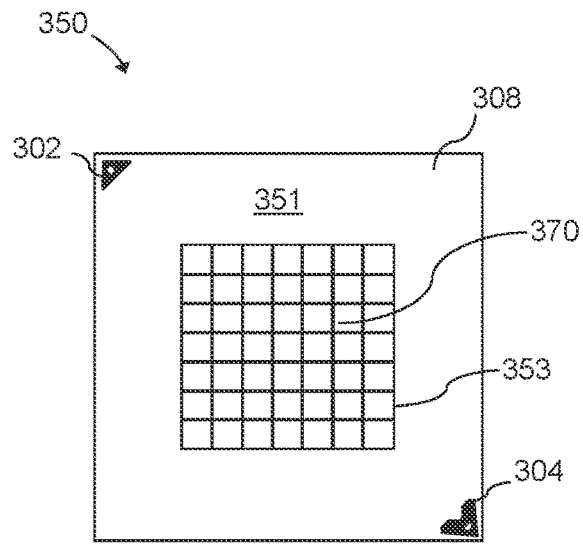
FIG. 3C illustrates a top schematic view of a light emitting diode (LED) device according to one or more embodiments.

With specific reference to FIG. 3C, which illustrates a top schematic view of a light emitting diode (LED) device according to one or more embodiments, the LED device 350 comprises the interposer body 308 and an LED die 370 attached thereto. Analogous to FIG. 3A, the first local fiducial 302 remains is located in one corner of the LED device 350, and the second local fiducial 304 remains located in the opposite corner. Border area 351 outside of a perimeter 353 of the LED die 370 contains no flux.

Figure 6:
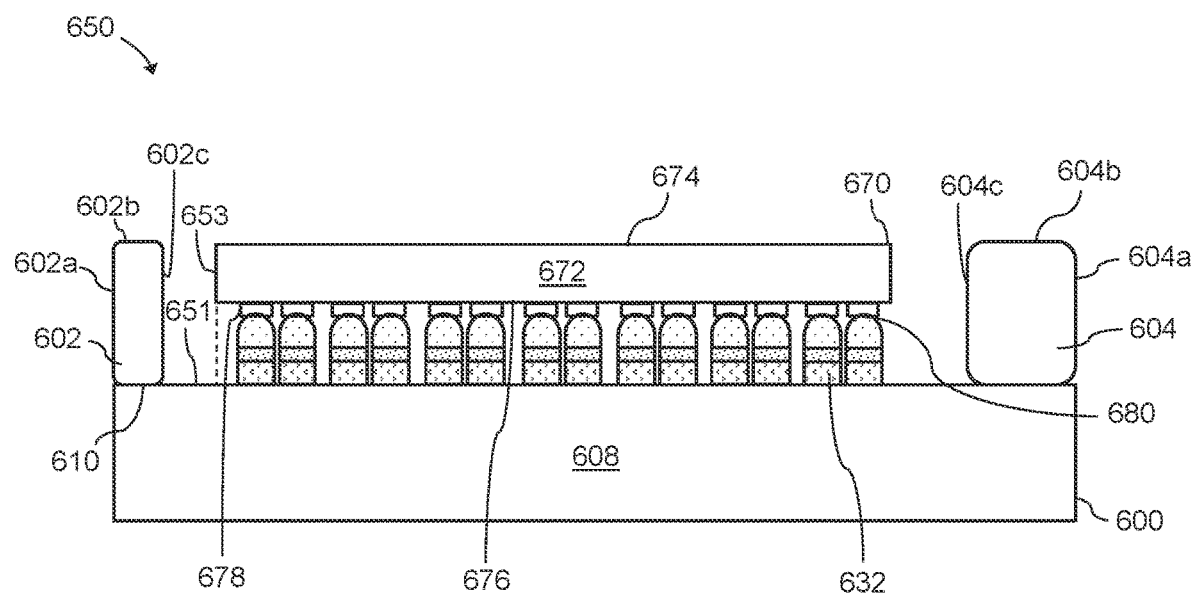
FIG. 6 illustrates a side schematic view of a light emitting diode (LED) device according to one or more embodiments.

As shown in FIG. 6, which illustrates a side schematic view of a light emitting diode (LED) device 650 comprising an interposer body 600 and an LED die 670 according to one or more embodiments, the flux material 680 is located between each of the pillars 632 and a second surface 676 of a die body 672, the second surface 676 of the die body 672 being opposite the first surface 674 of the die body 672. The coating 581b that was along the first surface 510 of the interposer body 508 at a base of the pillars of FIG. 5C is washed away during the washing operation 130.

With further regard to FIG. 6, the LED device 650, analogous to FIG. 3C, a first local fiducial 602 and a second local fiducial 604 are on a first surface 610 of the interposer body 608. Border area 651 outside of a perimeter 653 of the LED die 670 contains no flux. There is not flux on any of the surfaces 602a, 602b, 602c of the first local fiducial 602. Similarly, there is not flux on any of the surfaces 604a, 604b, 604c of the second local fiducial 604.

In one or more embodiments, the LED device 650 comprises a plurality of conductive 678 pads, each being located between the second die surface 676 and a top edge of each of the pillars.

As shown in FIG. 1, at operation 140, any optional further post-processing is conducted. Post-processing can include conducting any quality control testing and/or inspection.

In other post-processing, the LED device may be incorporated in a product, and/or the LED device may be combined with other LED devices, and/or further features such as optics may be added to the LED device. Devices that may benefit from the LED devices disclosed herein include flash arrays and/or automotive displays and/or motorized vehicle driver monitoring systems and/or augmented reality devices and/or virtual reality devices.

In some embodiments, LED devices herein further include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two- or three dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

Figure 2:
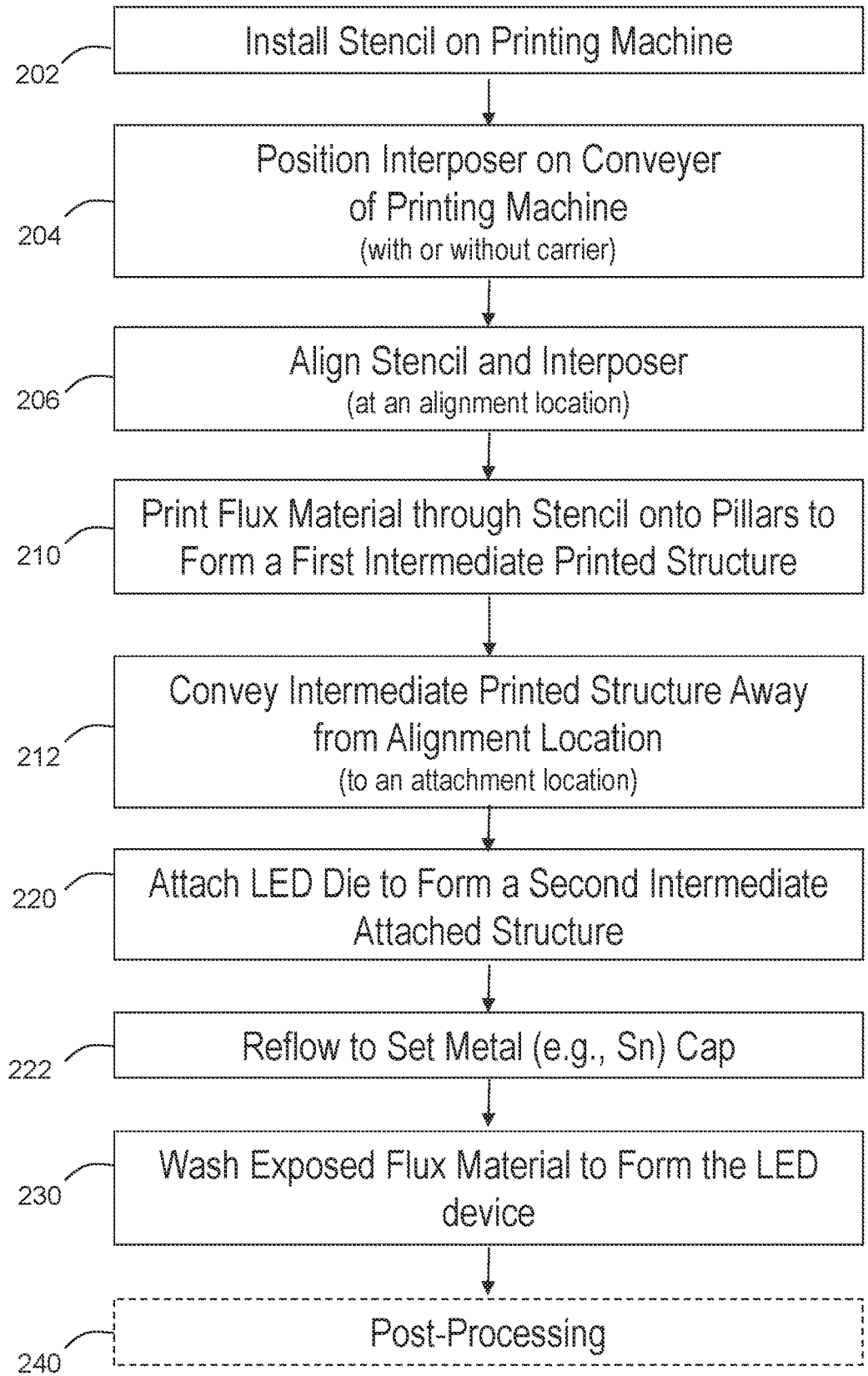
FIG. 2 provides a process flow diagram for manufacture of a light emitting diode (LED) device according to one or more embodiments.

Turning to FIG. 2, a process flow diagram for manufacture of a light emitting diode (LED) device according to one or more embodiments is provided. The method is discussed for a singled interposer using a printing machine, but multiple interposers may be processed during a given operation. The interposers may be of different dimensions. The interposers may be of differing layouts. It is understood that different operations may be conducted by equipment supplemental to the printing machine.

To begin, a method of manufacturing a light emitting diode (LED) device 200 comprises installing a stencil on a printing machine at operation 202. Stencils are designed in accordance with designs of interposers to be processed. The stencil is typically pre-aligned with the printing machine to a precise print position. The local fiducials on the interposer and the fiducial markings of the stencil will thereafter be precisely aligned with the machine during printing.

At operation 204 of FIG. 2, the interposer is installed on a conveyer of the printing machine. The interposer on the conveyer may be secured by use of a carrier sized to mate with the conveyor if the dimensions of the interposer vary from that of the conveyor. Precision in positioning the interposer on the conveyor is desired to ensure there is no off-set of the flux material during the printing process.

At operation 206 of FIG. 2, aligning the stencil and the interposer is done at an alignment location of the printing machine, where the conveyer conveys the interposer to a position below the stencil. The aligning operation is such that each of the pillars of the interposer is located within an opening in the stencil. According to one or more embodiments, aligning of the stencil and the interposer comprises aligning fiducial markings of the stencil with the two or more local fiducials of the interposer.

At operation 210 of FIG. 2, printing flux material through the stencil onto pillars to form a first intermediate printed structure is conducted analogously to the operation 110 discussed with respect to FIG. 1.

At operation 212 of FIG. 2, the first intermediate printed structure is conveyed away from the alignment location to an attachment location. An LED die is aligned with the first intermediate printed structure preferably with precision to ensure there is no off-set when attaching the LED die. In one or more embodiments, the aligning of the LED die and the interposer comprises aligning a center position of the LED die with a center position of the interposer.

At operation 220 of FIG. 2, attaching the LED die is conducted analogously to the operation 120 discussed with respect to FIG. 1 to form a second intermediate attached structure. The use of local fiducials facilitates accurate attachment of the LED die on the pillars. Using tacky flux material, whose application is consistently applied to the pillars by the printing operation, allows attachment to be controlled by time, force, and height control. The attachment is sufficient to ensure no die fly-off when conveying from the attachment location to an oven for reflow.

At operation 222 of FIG. 2, after attaching the LED die, the second intermediate attached structure is heated to reflow a metal cap of each of the pillars (e.g., a tin (Sn) cap). This is done in an oven at a location downstream of the attachment location. Thereafter, the structure allowed to cool to set the metal cap. Cooling may be done under ambient conditions, or by exposure to refrigeration conditions.

As shown in FIG. 2, at operation 230, washing exposed flux material from the second intermediate attached structure is conducted analogously to the operation 130 discussed with respect to FIG. 1.

In one or more embodiments, the methods herein are conducted on two or more interposers during a common operation.

In one or more embodiments, the methods herein are conducted in a continuous or semi-continuous operation to process a plurality of interposers. Reference to continuous means that a printing machine is maintained under specified conveyor speeds, operating temperatures and pressures, and raw material supply flow, such that operation is interrupted only to load interposers onto the conveyor and/or to remove finished LED devices. Semi-continuous allows also for minor interruptions to the raw material supply flow and adjustments to conveyor speed and operating temperatures and pressures.

As shown in FIG. 2, at operation 240, any optional further post-processing is conducted analogously to the operation 140 discussed with respect to FIG. 1.

LED Dies

LED dies comprise a plurality of LEDs are arranged in an array-type format. The LEDs may be integral to the die or may be placed and adhered thereto.

In one or more embodiments, the LED dies comprise a plurality or array of LEDs of varying colors, for example, red, blue, and/or green. In one or more embodiments, each of the LEDs is individually addressable and illuminable. In one or more embodiments, the LEDs of each LED are collectively addressed and illuminated. It is understood that the number of each color and arrangement of the same will be application-specific.

In one or more embodiments, arrays of micro-LEDs (μLEDs or uLEDs) are used. Micro-LEDs can support high density pixels having a lateral dimension less than 100 μm by 100 μm. In some embodiments, micro-LEDs with dimensions of about 50 μm in diameter or width and smaller can be used. Such micro-LEDs can be used for the manufacture of color displays by aligning in close proximity micro-LEDs comprising red, blue and green wavelengths.

In one or more embodiments, arrays of mini-LEDs are used. In some embodiments, the mini-LEDs have dimensions greater than or equal to 100 micrometers. In one or embodiments, one or more dimensions of height, width, depth, thickness have values in a range of 100 to 1000 micrometers.

In some embodiments, the light emitting arrays include small numbers of micro- or mini-LEDs provided by LED dies that are centimeter scale area or greater. In some embodiments, the light emitting arrays include micro-LED or mini-LED pixel arrays with hundreds, thousands, or millions of light emitting LEDs positioned together on centimeter scale area substrates or smaller. In some embodiments, the LED dies include light emitting diodes sized between 30 microns and 500 microns. The light emitting array(s) can be monochromatic, RGB, or other desired chromaticity. In some embodiments, pixels can be square, rectangular, hexagonal, or have curved perimeter. Pixels can be of the same size, of differing sizes, or similarly sized and grouped to present larger effective pixel size.

EXEMPLARY APPLICATION

Figure 7:
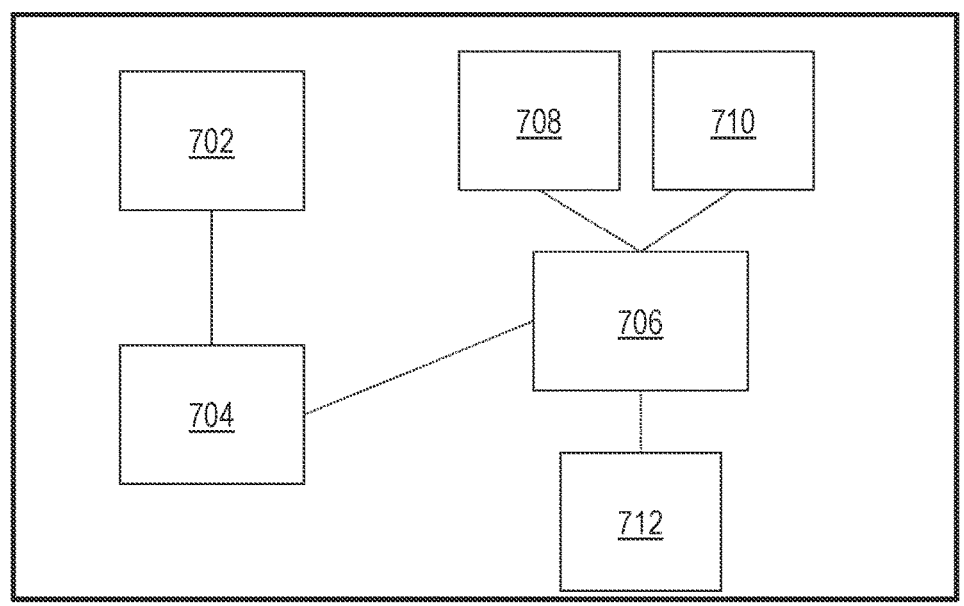
FIG. 7 schematically illustrates an exemplary camera flash system comprising LED devices according to embodiments herein.

FIG. 7 schematically illustrates an exemplary camera flash system 700 utilizing LED devices disclosed herein. The camera flash system 700 comprises an LED device 702 in electrical communication with an LED driver 704. The camera flash system 700 also comprises a controller 706, such as a microprocessor. The controller 706 is coupled to the LED driver 704. The controller 706 may also be coupled to a camera 708 and to sensor(s) 710, and operate in accordance with instructions and profiles stored in memory 712. The camera 708 and the LED device 702 may be controlled by the controller 706 to match their fields of view.

Sensors 710 may include, for example, positional sensors (e.g., a gyroscope and/or accelerometer) and/or other sensors that may be used to determine the position, speed, and orientation of system 700. The signals from the sensors 710 may be supplied to the controller 706 to be used to determine the appropriate course of action of the controller 706 (e.g., which LEDs are currently illuminating a target and which LEDs will be illuminating the target a predetermined amount of time later).

In operation, illumination from some or all of the pixels of the LED array in 702 may be adjusted—deactivated, operated at full intensity, or operated at an intermediate intensity. As noted above, beam focus or steering of light emitted by the LED device in 702 can be performed electronically by activating one or more subsets of the pixels, to permit dynamic adjustment of the beam shape without moving optics or changing the focus of the lens in the lighting apparatus.

EMBODIMENTS

Various embodiments are listed below. It will be understood that the embodiments listed below may be combined with all aspects and other embodiments in accordance with the scope of the invention.

Embodiment (a) A light emitting diode (LED) device comprising: an interposer comprising: an interposer body, a plurality of pillars on a first surface of the interposer body, and two or more local fiducials on the first surface of the interposer body; an LED die comprising a die body and a first die surface comprising a plurality of light emitting diodes (LEDs), the LED die being mounted on the plurality of pillars; and a flux material located between each of the pillars and a second die surface of the die body, the second die surface of the die body being opposite the first die surface, there being no flux material on a the first surface of the interposer outside of a perimeter of the LED die.

Embodiment (b) The LED device of embodiment (a) wherein there is no flux material on a fiducial surface of each of the local fiducials.

Embodiment (c) The LED device of any one of embodiments (a) to (b), wherein each of the plurality of LEDs comprises a width in a range of greater than or equal to 75 micrometers to less than or equal to 300 micrometers.

Embodiment (d) The LED device of any one of embodiments (a) to (c), wherein the flux material comprises a water soluble material.

Embodiment (e) The LED device of any one of embodiments (a) to (d), wherein each of the pillars of the plurality of pillars comprises two or more layers of different materials.

Embodiment (f) The LED device of any one of embodiments (a) to (e), wherein each of the pillars of the plurality of pillars comprises a first layer comprising copper, the first layer being in contact with the first surface of the interposer body, a second layer comprising nickel, the second layer being in contact with the first layer, and a third layer comprising tin, the third layer being in contact with the second layer.

Embodiment (g) The LED device of any one of embodiments (a) to (f) comprising a plurality of conductive pads between the second die surface and a top edge of each of the pillars.

Embodiment (h) A method of manufacturing a light emitting diode (LED) device comprising: printing a flux material onto a pillar surface of each pillar of a plurality of pillars on a first surface of an interposer body of an interposer such that the first surface is not printed with the flux material to form a first intermediate printed structure; attaching an LED die comprising a die body and a first die surface comprising a plurality of light emitting diodes (LEDs) to the first intermediate printed structure with the flux material such that the flux material is located between each of the pillars and a second surface of the die body, the second surface of the die body being opposite the first surface of the die body to form a second intermediate attached structure; and washing away the flux material where it is exposed to form the LED device.

Embodiment (i) The method of embodiment (h), wherein a fiducial surface of each of two or more local fiducials on the first surface of the interposer body is not printed with the flux material.

Embodiment (j) The method of any one of embodiments (h) to (i), wherein each of the plurality of LEDs comprises a width in a range of greater than or equal to 75 micrometers to less than or equal to 300 micrometers.

Embodiment (k) The method of any one of embodiments (h) to (j), wherein the flux material comprises a water soluble material.

Embodiment (l) The method of any one of embodiments (h) to (k), wherein the printing of the flux material comprises: aligning a stencil comprising a plurality of openings with the interposer such that each of the pillars is located within an opening in the stencil; and depositing the flux material in each of the openings such that at least a top edge of each of the pillars receives a coating of the flux material.

Embodiment (m) The method of embodiment (l), wherein the depositing of the flux material in each of the openings comprises pushing the flux material through the plurality of opening using a blade.

Embodiment (n) The method of any one of embodiments (l) to (m), wherein each of the openings of the stencil is greater than a width of each of the pillars by 10 micrometers or larger.

Embodiment (o) The method of any one of embodiments (l) to (n), wherein the aligning of the stencil and the interposer comprises aligning fiducial markings of the stencil with two or more local fiducials of the interposer.

Embodiment (p) The method of any one of embodiments (l) to (o), wherein prior to the printing of the flux material, the stencil is installed on a printing machine, and the interposer is positioned on a conveyer of the printing machine.

Embodiment (q) The method of embodiment (p), wherein the positioning of the interposer on the conveyer comprises securing the interposer in a carrier sized to mate with the conveyer.

Embodiment (r) The method of any one of embodiments (h) to (q), wherein the attaching of the LED die comprises: conveying the first intermediate printed structure to an attachment location; aligning the LED die with the interposer; and positioning the LED die on the plurality of pillars.

Embodiment (s) The method of embodiment (r), wherein the aligning of the LED die and the interposer comprises aligning a center position of the LED die with a center position of the interposer.

Embodiment (t) The method of any one of embodiments (h) to (s) comprising heating the second intermediate attached structure to reflow a metal cap of each of the pillars and cooling thereafter to set the metal cap.

Embodiment (u) The method of any one of embodiments (h) to (t), wherein the flux material is printed onto two or more interposers during a common operation.

Embodiment (v) The method of any one of embodiments (h) to (u) being conducted in a continuous or semi-continuous operation to process a plurality of interposers.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

What is claimed is:

1. A method of manufacturing a light emitting diode (LED) device comprising:
    aligning a stencil comprising a plurality of openings with a plurality of pillars on a first surface of an interposer body of an interposer such that each of the pillars is located within an opening in the stencil, the interposer body further comprising two or more local fiducials extending from the first surface of the interposer body, and the stencil comprising two or more features to cover the two or more local fiducials, respectively;
    resting the stencil on the local fiducials by way of the features such that the stencil does not contact the plurality of pillars;
    stencil printing a flux material onto a pillar surface of each pillar of the plurality of pillars such that at least a portion of the first surface outward from a perimeter formed by outermost pillars is not printed with the flux material to form a first intermediate printed structure;
    attaching an LED die comprising a die body and a first die surface comprising a plurality of light emitting diodes (LEDs) to the first intermediate printed structure with the flux material such that the flux material is located between each of the pillars and a second surface of the die body, the second surface of the die body being opposite the first surface of the die body to form a second intermediate attached structure; and
    removing the flux material where it is exposed to form the LED device.

2. The method of claim 1, comprising not printing the flux material onto fiducial surfaces of each of the two or more local fiducials when stencil printing the flux material onto the pillar surface of each pillar of the plurality of pillars.

3. The method of claim 1, wherein each of the plurality of LEDs comprises a width in a range of greater than or equal to 75 micrometers to less than or equal to 300 micrometers.

4. The method of claim 1, wherein the flux material comprises a water soluble material.

5. The method of claim 1 further comprising:
    and
    depositing the flux material in each of the openings of the stencil such that at least a top edge of each of the pillars receives a coating of the flux material.

6. The method of claim 5, wherein the depositing of the flux material in each of the openings comprises pushing the flux material through the plurality of openings using a blade.

7. The method of claim 1, wherein each of the openings of the stencil is greater than a width of each of the pillars by 10 micrometers or larger.

8. The method of claim 1, wherein the aligning of the stencil and the interposer comprises aligning fiducial markings of the stencil with two or more local fiducials of the interposer.

9. The method of claim 1, wherein prior to the stencil printing of the flux material, the stencil is installed on a printing machine, and the interposer is positioned on a conveyer of the printing machine.

10. The method of claim 1, wherein the attaching of the LED die comprises:
    conveying the first intermediate printed structure to an attachment location;
    aligning the LED die with the interposer; and
    positioning the LED die on the plurality of pillars.

11. The method of claim 1 comprising heating the second intermediate attached structure to reflow a metal cap of each of the pillars and cooling thereafter to set the metal cap.

12. The method of claim 1, wherein the flux material is printed onto two or more interposers during a common operation.

13. The method of claim 1 being conducted in a continuous or semi-continuous operation to process a plurality of interposers.

14. The method of claim 1, wherein the first surface is not printed with the flux material.

15. The method of claim 1, wherein the removing of the flux material comprises washing away the flux material.

16. The method of claim 15, wherein the washing away comprises directing one or more direct jets of water at the first surface of the interposer body.

\* \* \* \* \*